United States Patent
Hayes et al.

(10) Patent No.: US 10,613,159 B2
(45) Date of Patent: Apr. 7, 2020

(54) MAGNETOELECTRIC MAGNETIC FIELD MEASUREMENT WITH FREQUENCY CONVERSION

(71) Applicant: Christian-Albrechts-Universitaet zu Kiel, Kiel (DE)

(72) Inventors: Patrick Hayes, Schoenkirchen (DE); Andre Piorra, Kiel (DE); Reinhard Knoechel, Elmshorn (DE); Eckhard Quandt, Heikendorf (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 91 days.

(21) Appl. No.: 15/578,751

(22) PCT Filed: May 31, 2016

(86) PCT No.: PCT/DE2016/100250
§ 371 (c)(1),
(2) Date: Dec. 1, 2017

(87) PCT Pub. No.: WO2016/198042
PCT Pub. Date: Dec. 15, 2016

(65) Prior Publication Data
US 2018/0299514 A1   Oct. 18, 2018

(30) Foreign Application Priority Data
Jun. 8, 2015 (EP) .................................. 15170985

(51) Int. Cl.
*G01R 33/00* (2006.01)
*G01R 33/06* (2006.01)
(Continued)

(52) U.S. Cl.
CPC ............ *G01R 33/0041* (2013.01); *G01B 7/16* (2013.01); *G01R 33/02* (2013.01); *G01R 33/06* (2013.01);
(Continued)

(58) Field of Classification Search
CPC ............ G01B 7/16; G01R 33/02; H01L 41/00
See application file for complete search history.

(56) References Cited

U.S. PATENT DOCUMENTS

| 7,573,261 | B1 * | 8/2009 | Vinogradov | ........... G01N 27/82 324/240 |
| 8,222,898 | B1 | 7/2012 | Edelstein | |

(Continued)

FOREIGN PATENT DOCUMENTS

| DE | 102011008866 A1 | 7/2012 |
| EP | 2538235 A1 | 7/2013 |

(Continued)

OTHER PUBLICATIONS

International Search Report dated Sep. 26, 2016, in International Application No. PCT/DE2016/100250.

*Primary Examiner* — Jermele M Hollington
*Assistant Examiner* — Alvaro E Fortich
(74) *Attorney, Agent, or Firm* — Patent Central LLC; Stephan A. Pendorf

(57) ABSTRACT

A magnetic field measuring method using a magnetoelectric composite element as an oscillator, in which a time-dependent measurement magnetic field acts on the magnetostrictive phase of the composite element, and an electrical measurement voltage is tapped off across the piezoelectric phase of the composite element and is used to infer the measurement magnetic field. At least one dielectric phase is connected to the magnetostrictive phase of the composite element by a material bond. When an electrical voltage is (Continued)

Figure 1:
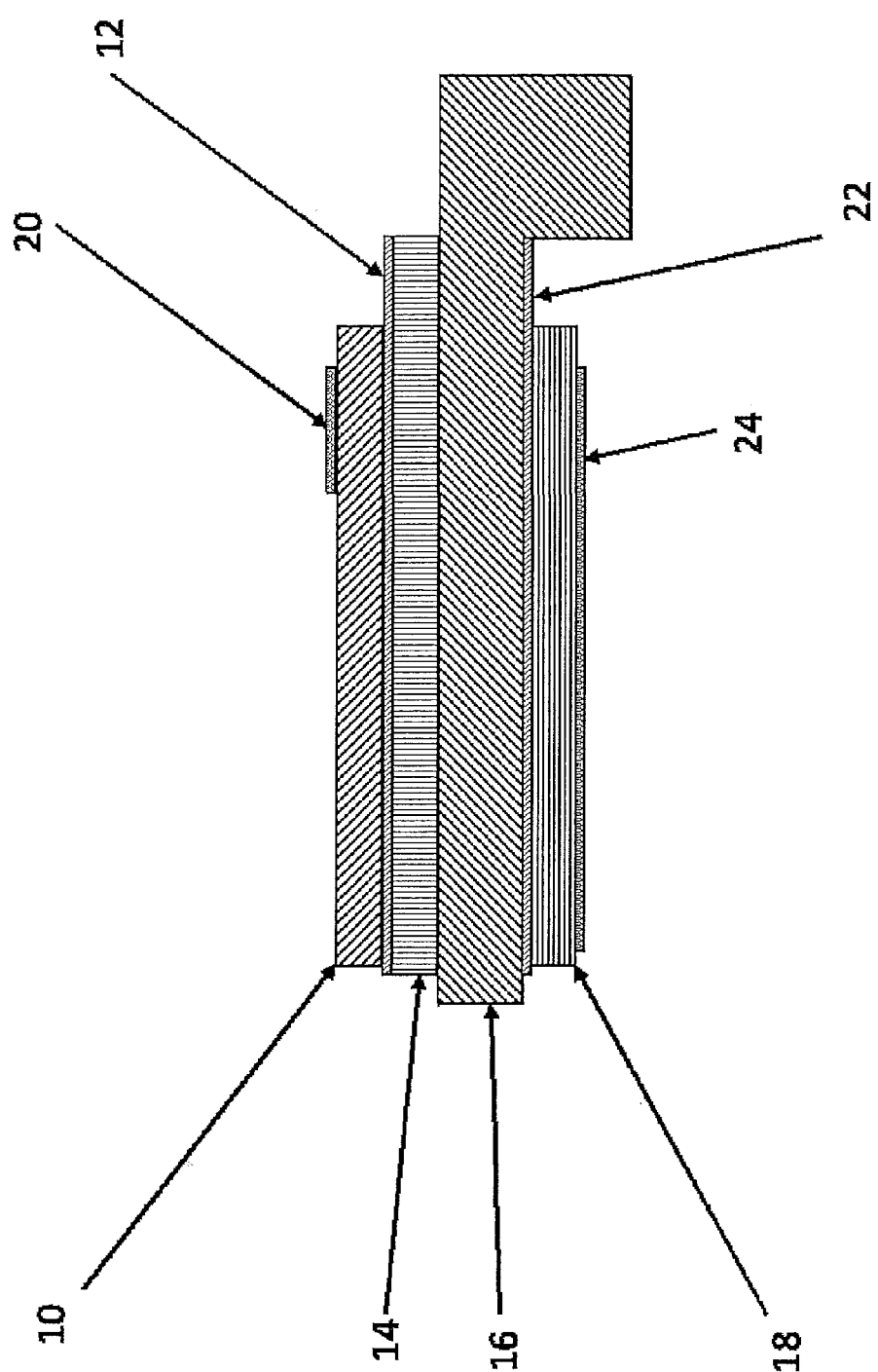

applied, the dielectric phase exhibits a change in length, the magnitude of which depends in a non-linear manner on the magnitude of the voltage, and a temporally periodic electrical modulation voltage is applied to the dielectric phase.

9 Claims, 2 Drawing Sheets

(51) Int. Cl.
    *H01L 41/00*     (2013.01)
    *G01R 33/09*     (2006.01)
    *G01R 33/18*     (2006.01)
    *H01L 41/047*     (2006.01)
    *G01B 7/16*     (2006.01)
    *G01R 33/02*     (2006.01)

(52) U.S. Cl.
    CPC .............. *G01R 33/09* (2013.01); *G01R 33/18* (2013.01); *H01L 41/00* (2013.01); *H01L 41/047* (2013.01)

(56) References Cited

U.S. PATENT DOCUMENTS

| | | | | |
|---|---|---|---|---|
| 2001/0028245 | A1* | 10/2001 | Li | G01R 33/02 324/312 |
| 2006/0154617 | A1* | 7/2006 | Clingman | H01Q 3/44 455/78 |
| 2010/0263457 | A1* | 10/2010 | Yoneda | G01L 3/102 73/862.335 |
| 2013/0289913 | A1* | 10/2013 | Jahns | G01R 33/06 702/65 |
| 2014/0125332 | A1 | 5/2014 | Lage et al. | |
| 2014/0217932 | A1* | 8/2014 | Bright | H01L 41/12 318/118 |
| 2015/0168503 | A1* | 6/2015 | Kim | G01R 33/0286 324/244 |
| 2015/0247904 | A1* | 9/2015 | Piorra | H01L 41/00 324/252 |

FOREIGN PATENT DOCUMENTS

| | | |
|---|---|---|
| EP | 2635913 B1 | 12/2013 |
| EP | 2717343 B1 | 9/2014 |

\* cited by examiner

MAGNETOELECTRIC MAGNETIC FIELD MEASUREMENT WITH FREQUENCY CONVERSION

The invention relates to a method and device for measuring time-varying magnetic fields by means of sensors comprised of a magneto-electric composite, also called, in short, ME sensors.

Magnetoelectric composites are polymorphic materials, which are formed from at least two material phases in firmly bonded connection, for example soldered or glued together: a magnetostrictive phase and a piezoelectric phase.

The magnetostrictive phase is typically metallic, e.g. ferromagnetic transition metals iron, nickel, cobalt (Fe, Ni, Co) and their alloys, compounds of the rare earths terbium, dysprosium, samarium (Tb, Dy, Sm) with the ferromagnetic transition metals (e.g. $TbFe_2$, $SmFe_2$), ferromagnetic glasses mainly containing the elements iron, cobalt, boron (B) or silicon (Si) in varying proportions or gallium (Ga) containing materials FeGa and FeGaB. Furthermore, the magnetostrictive phase may also be formed from a non-conductive material, such as $CoFeO_3$ or $NiFeO_3$. Under the influence of a magnetic field, it undergoes a change in length, shape or volume.

The piezoelectric phase, for example made of lead-zirconate-titanat (PZT), polyvinylidene fluoride (PVDF), aluminum nitride (AlN), also experiences a change in length in response to a magnetic field due to the material-locking connection with the magnetostrictive phase in the ME composite, thereby producing a measurable change in the electrical polarization, which can be detected as an electrical voltage or charge change by means of a measuring electrode arrangement located directly on the piezoelectric phase.

The ME sensor principle for magnetic field measurement is based on the mechanical coupling of the two phases.

There are no compulsory requirements on the shaping of the two material phases. For example, bulk materials of any shape can be joined together, in particular glued together, and thereafter form a magneto-electric composite element according to the given shape.

It has proven to be useful and is common today to deposit both phases as layers on each other and to cut along the layer planes in rectangular strip shape. The strips are primarily sensitive to magnetic field vector components that are directed parallel to the long strip axis.

In the presence of such a magnetic field the strips perform a bending or stretching movement, depending on the strip structure, and can be excited by a temporally periodic magnetic field to mechanical vibrations, if they are mounted for oscillation, e.g. clamped on one end. ME sensors are basically designed as mechanical oscillators and have a mechanical natural frequency, which can be easily determined.

The tap of the measured voltage across the piezoelectric phase is effected by means of the mentioned measuring electrode assembly, typically across the layer thickness, wherein a metallic magnetostrictive phase can be used as a counter electrode. However, it is also known from EP 2 717 343 B1 to design the measuring electrode arrangement, for example as an interdigital electrode, and to measure along the layer, which has advantages in particular in the production of ME sensors in thin-film technology. The same patent also teaches that it is by no means necessary to deposit the two material phases directly on one another in order to obtain a sensor-capable ME composite. The mechanical coupling of the phases can also be effected by a sufficiently rigid, otherwise dielectric and comparatively very thick separating layer.

ME sensors are, absent further actuation, sensitive only to alternating magnetic fields and are usually operated also outside of their mechanical resonance. Since one is interested in the largest possible dynamic range, the largest possible signal-to-noise ratio and the linearity of the voltage response with respect to the alternating magnetic field to be measured, one chooses for the ME sensor an operating point in the region of the largest increase of the magnetostriction characteristic. The first derivative of the magnetostriction characteristic is called the piezomagnetic coefficient. The magnetostriction characteristic describes the expansion of length of the magnetostrictive phase under the action of a magnetic field. Its course is always axis symmetric, as both field directions have the same effect on the material. The expansion of length initially has a parabolic rise for small field strengths, but is upwards limited for large field strengths—when reaching the saturation magnetization. It therefore has a turning point, at which the linear increase dominates and where at the same time there is the largest slope. In order to operate the ME sensor at this favorable operating point, a constant bias magnetic field is preferably applied by the appropriate arrangement of electrical conductors or permanent magnets.

However, such a static bias magnetic field is not without problems in practice. Especially in the case of several ME sensors in close proximity to one another, mutual influences of the magnetic bias fields can occur, in particular if the fields are generated according to the Biot-Savart law and the currents are to be conducted via supply lines. Permanent magnetic bias fields are more energetically favorable, but require the placement of a sufficient amount of magnetic material to achieve appropriate field strengths.

The detection limit of a ME sensor has a typical frequency dependence, which is determined by the inherent noise such as the thermal noise or the frequency-dependent 1/f current noise of the electronic amplifier and the frequency-dependent magnetoelectric coefficient. The latter describes the ratio of the electrical field strength amplitude produced in the ME sensor to the exciting magnetic field strength amplitude. The magnetoelectric coefficient shows a significant increase in the range of the mechanical natural frequency of a ME sensor, which is due to the resonance amplification of the vibration amplitude.

Particularly for low frequencies of the alternating magnetic field, e.g. 1-10 Hz, as relevant for biomagnetic measurements, there results due to the abovementioned a significant deterioration of the detection limit. Due to the 1/f noise one loses about 3 orders of magnitude of sensitivity and, due to the lack of resonance amplification in this low frequency range, another 2-3 orders of magnitude. This means that the detection limits achieved via the mechanical resonance at about 1 kHz of better than 1 $pT/Hz^{1/2}$ deteriorate at 1 Hz to at least 100 $nT/Hz^{1/2}$.

The patent EP 2 635 913 B1 addresses the problem of measuring slowly changing, weak magnetic fields with ME sensors. There, a frequency conversion in the mechanical resonance of the ME sensor is proposed, which is achieved by superimposing on the magnetic field to be measured, referred to in the following as measuring magnetic field, a controlled modulation magnetic field on the sensor. The document leads to the fact that the course of the magnetostriction characteristic is the reason why the sensor detects magnetic field components with mixed frequencies, in particular those which exhibit the sum and difference of measuring magnetic field frequency, referred to in the following as short field frequency, and modulation field frequency, referred to in the following as short modulation frequency. This makes it possible, by means of a targeted selection of the modulation frequency suitable for the previously known mechanical natural frequency of the ME sensor, to detect a measuring magnetic field with a very low measuring field frequency in the resonance of the ME sensor. The signal at the measurement field frequency is converted by a physical mixing process to the resonant frequency for its detection.

Furthermore, EP 2 635 913 B1 states that, in the event that a spectrum of low measurement frequencies is to be investigated, it is also possible to vary the modulation frequency over a correspondingly complementary frequency band in order to sequentially convert and detect a plurality of measurement frequencies.

In addition to avoiding the 1/f noise and the resonance amplification of slowly oscillating magnetic field components, the frequency conversion also has the advantage that the ME sensor does not have to be equipped directly with a bias DC field. In particular, no permanent magnets are required. However, it is found to be advantageous to provide the modulation magnetic field with an amplitude which just corresponds to the amount of the conventional bias field.

U.S. Pat. No. 8,222,898 B1 discloses a device which implements exactly the same concept of frequency conversion by arranging a control-energized coil around the ME sensor to generate a modulation magnetic field with a modulation frequency in an interval complementary to the measurement frequency.

The disadvantages of the previously known frequency conversion in ME sensors lie in the need to generate a homogeneous, temporally variable modulation magnetic field with suitable apparatus. Providing such means is complex and costly. It is difficult to generate the modulation magnetic field at high modulation frequencies. Moreover, magnetic field generation consumes a lot of energy according to the Biot-Savart law. Last but not least, the modulation magnetic field intensities are also large compared to the field strengths and can significantly disturb adjacent sensors, if, for example, several measuring field components are to be measured simultaneously.

The invention therefore has as its object to provide a magnetic field measurement with ME-sensor and frequency conversion, which does not require a modulation magnetic field and, in terms of apparatus, is very simple.

According to the method, the object is achieved by the main claim, namely by a magnetic field measuring method with a magnetoelectric composite element as an oscillator, wherein a time-dependent measuring magnetic field acts on the magnetostrictive phase of the composite element, an electrical measuring voltage is tapped over the piezoelectric phase of the composite element, and the measuring magnetic field is deduced therefrom, characterized by the steps of (i) providing at least one dielectric phase in material connection with the magnetostrictive phase of the composite element, wherein the dielectric is a phase exhibits a change in length upon application of an electric voltage, of which the lengthening amount depends non-linearly on the magnitude of the voltage, and (ii) applying a temporally periodic electrical modulation voltage to the dielectric phase.

According to the device, the object is achieved in a first embodiment by a magnetic field measuring device comprising a magnetoelectric composite element with a piezoelectric phase with a non-linear stress-strain characteristic curve, wherein the composite element is formed as a mechanically oscillatable oscillator, and an electrode arrangement on the piezoelectric phase, as well as a means for tapping an electrical measuring voltage across the piezoelectric phase upon deflection of the oscillator, characterized by a device for subjecting the piezoelectric phase with a temporally periodic electrical voltage modulation.

The object is according to the direction achieved in a second embodiment by a magnetic field measuring device comprising a magneto-electric composite element, the composite element formed as a mechanically oscillatable oscillator, and a first electrode structure on the piezoelectric phase of the composite member, as well as a means for tapping an electrical measuring voltage across the piezoelectric phase at deflection of the oscillator, characterized by a dielectric phase with non-linear stress-strain characteristic curve firmly (materially) bonded with the composite member and a second electrode assembly on the dielectric phase, and means for applying to the dielectric phase a temporally periodic electrical modulation voltage.

Further advantageous embodiments are set forth in the dependent claims.

In the second embodiment of the above device—in contrast to the first embodiment—no further requirements are placed on the piezoelectric phase of the composite element. Instead, an additional dielectric phase is arranged materially bonded on the composite element, which shows a non-linear change in length when an electrical voltage is applied. This dielectric phase may also be piezoelectric. It may in particular be formed from a ferroelectric. However, it can also be formed from a relaxor material that exhibits high electrostriction, and is not necessarily piezoelectric.

Suitable ferroelectrics for the implementation of the invention include, for example, lead zirconate titanate (PZT), barium titanate, potassium sodium niobate (KNN) or sodium bismuth titanate (NBT), to name only a small selection.

Relaxors are related to the ferroelectrics. Similar to ferroelectrics, they show a paraelectric state at higher temperatures. When the temperature is lowered, they show no conversion to the ferroelectric state associated with phase transformation, but a broad, diffused, and highly frequency dependent transition that is not associated with structural transformation. Consequently, they are still cubic and therefore centrosymmetric, not piezoelectric. However, they show a very high electrostriction. Examples of relaxor materials are lead magnesium niobate (PMN) and lead lanthanum zirconium titanate (PLZT).

As in EP 2 635 913 B1, the principle of frequency conversion is to change the measurement voltage via a piezoelectric phase, which in turn is caused by an expansion of a magnetostrictive phase caused by a measuring magnetic field, in time with a predetermined periodic modulation. The modulation always takes place with a signal of high amplitude, referred to in the following as large signal, passing through a non-linear region of a material-specific strain characteristic, in the presence of a smaller amplitude measurement signal, referred to in the following as small signal, for which additional modulation the strain characteristic behaves approximately linearly because of the small size of the amplitude.

In the ME sensor measurement of e.g. biomagnetic signals, the small signal is of a much lower frequency than the large signal, i.e., over a period of the large signal the small signal hardly changes. The small signal "sees" temporally variable material properties, which are caused by the large signal. In particular, the piezoelectric coefficient in the piezoelectric phase provided for tapping the measuring voltage is modulated at the predetermined rate.

In the case of EP 2 635 913 B1 the modulation takes place magnetically, i.e., a magnetic modulation magnetic field is provided which, via the magnetostrictive phase—comprising a previously known, axisymmetric and therefore non-linear magnetostriction characteristic—also expands the piezoelectric phase and thereby the piezoelectric coefficient is modulated. The time course of the elongation by the small signal is commutated by the large signal (beat) and converted via the piezoelectric phase into a voltage, the voltage containing frequency components containing the intrinsic period of the oscillating ME sensor, when the modulation frequency is set to match the measuring field frequency. As a result, there is a resonance amplification of the low-frequency small signal, i.e., the measuring magnetic field.

In the presently described inventive magnetic field measurement there is as control, in contrast, a specially constructed for this purpose, time-periodic modulation voltage as large signal for the piezoelectric phase provided for tapping the measurement voltage. The conversion of the modulation voltage into an elongation or change in length of the piezoelectric phase of the ME-sensor provided for signal tapping is carried out according to the invention by the change in length of a dielectric firmly bonded to the ME-sensor as a function of time-periodic modulation voltage. The dielectric or the dielectric phase has to have a non-linear stress-strain characteristic curve, which even extended areas of the non-linearity must be passed through by the modulation voltage; otherwise there will be no frequency conversion at the ME sensor. The dielectric phase with non-linear strain-voltage characteristic may, with appropriate material selection, be identical to the piezoelectric phase for tapping the measurement voltage. An additional small-signal strain acts on the magnetostrictive phase, which is converted into measurement voltage at the piezoelectric phase according to the differential piezoelectric coefficient. Since the differential piezoelectric coefficient is positive for positive modulation voltage (and vice versa), the resulting measurement voltage also commutates in time with the modulation voltage, which ultimately acts similar, as with the magnetic modulation.

The electrically driven modulation of the ME sensor is substantially faster and more energy efficient than the magnetic modulation.

In the above-mentioned first embodiment of the magnetic field measuring device according to the invention, the modulation voltage is applied to the piezoelectric phase of a known ME-sensor, wherein the piezoelectric phase must have a non-linear stress-strain characteristic curve. The piezoelectric phase may be formed for example of PZT. However, according to experimental findings, it is inadequate if the piezoelectric phase is formed for instance of aluminum nitride (AlN), since this material exhibits a pronounced linear expansion behavior over large voltage ranges. The desired frequency conversion is then not observed. A piezoelectric phase with non-linear stress-strain characteristic curve simultaneously performs two functions: (i) it causes the non-linear stretching of the magneto-electric composite element in response to the modulation voltage and (ii) it serves the tapping of the piezoelectric measuring voltage, as soon as a time-dependent magnetic field acts on the magnetostrictive phase.

In the second embodiment of the magnetic field measuring device according to the invention an additional dielectric layer with non-linear stress-strain characteristics is arranged firmly bonded on the composite element and is acted upon with the modulation voltage. This additional material phase only has the function of a drive, which non-linearly converts the modulating voltage into an elongation and transfers these to the magnetostrictive phase via the firm bonding (materially bonding) of the phases. The dielectric phase is preferably formed from a ferroelectric, for example from PZT, or from a relaxor material. In particular, any dielectric material is suitable which shows pronounced electrostriction, since analogous to the magnetostriction the electrostriction characteristic also is axisymmetric and thus significantly non-linear. For example, lead magnesium niobate (PMN) exhibits such electrostriction. In contrast, the piezoelectric phase in the second embodiment only serves to pick up the measuring voltage in the presence of a time-dependent magnetic field. It can be comprised, for example, of PZT, PVDF or even be formed of aluminum nitride.

The modulation voltage is to be periodic in time, and preferably exhibit a period duration which by differs by a predetermined difference greater zero from the natural period of the mechanical oscillator—that is, the ME-sensor. It may have a harmonic time course, but it may also be a periodic triangular or square wave voltage or the like. The modulation voltage should preferably cause the ME sensor to a forced oscillation different from its natural frequency.

In a preferred embodiment the modulation voltage is a square-wave voltage, that reciprocates the differential piezoelectric coefficients in the piezoelectric phase intended for measurement voltage tapping back and forth between positive and negative values. Particular preference is given to realizing positive and negative maximum values.

Figure 2:
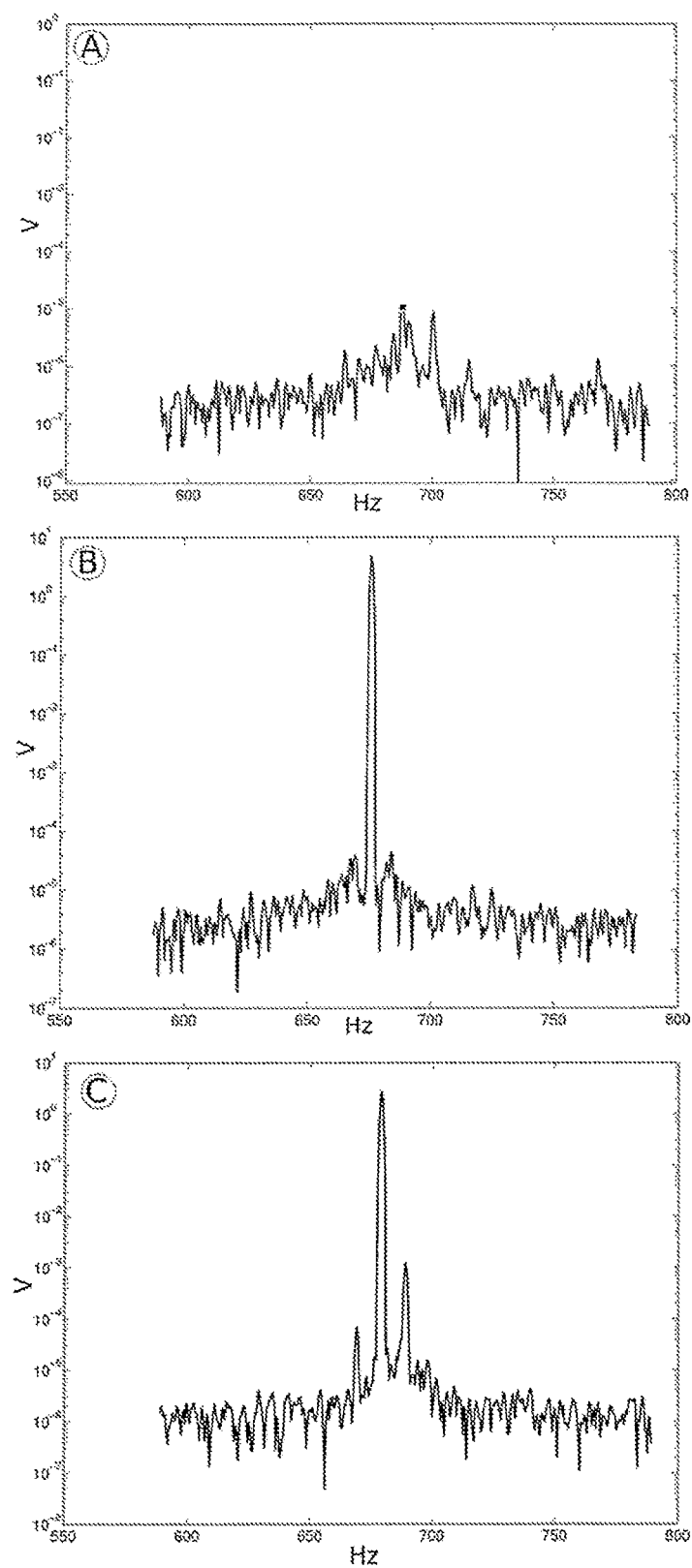

The invention will be explained in more detail below with reference to an embodiment and the explanation of measurement data. Here, the figures show:

FIG. 1 the sectional sketch of a strip-shaped ME sensor according to the described second embodiment of the magnetic field measuring device;

FIG. 2 the measurement voltages of a ME sensor of the structure of FIG. 1, which has been realized in thin-film technology.

FIG. 1 shows a sectional sketch through a ME sensor in strip form, which can be realized as an exemplary embodiment of the second embodiment of the magnetic field measuring device in thin-film technology. The sketch is not to scale.

On a silicon substrate film (16) with a film thickness of 300 m, a magnetostrictive layer system (14) according to the teaching of EP 2 538 235 B1 with FeCoSiB as the magnetostrictive material is placed on the upper side. This layer system (14) contains antiferromagnetic layers and forms by exchange bias layer-bound magnetic fields, which promote the layer system (14) in total into an operating point with a favorable piezomagnetic coefficient, without significant stray magnetic fields occurring outside of the layer system (14). The bias DC field set up using exchange bias is around 5 Oe.

On the layer system (14) and on the underside of the substrate film (16) 100 nanometer thick metallic layers of tantalum/platinum are applied respectively, which also serve as sub-electrodes (12, 22).

The piezoelectric phase (10)—here: layer with 2 μm thickness—is formed in this example of aluminum nitride on the upper sub-electrode (12). The dielectric phase (18)—here: layer with 2 μm thickness—with non-linear stress-strain curve is formed of PZT and applied to the lower sub-electrode (22).

Between the—usually—conductive, magnetostrictive phase (14) and the piezoelectric phase (10), the sub-electrode (12) is usually not mandatory. It serves primarily to cancel the texture to produce a better piezoelectric layer (10) and is incidentally used as a subelectrode (12).

In contrast, it is essential to provide a first electrode arrangement (20) on the piezoelectric layer (10) for picking up the measuring voltage. In addition, in the second embodiment of the magnetic field measuring device according to the invention, a second electrode arrangement (24) is applied to the dielectric layer (18) with a non-linear strain-voltage characteristic. This is used to create the modulation voltage according to the invention, in the present example via the dielectric layer (18) by means of the electrodes (22, 24). The respective outer electrodes (20, 24) are made of chrome/gold and are about 100 nanometers thick.

Compared to the second embodiment of the magnetic field measuring device, in the first embodiment all material layers (18, 22, 24) on the underside of the substrate film (16) are dispensed with, provided that the piezoelectric phase (10) is made of a material with non-linear stress-strain characteristic is formed, for example, PZT, but in particular not made of aluminum nitride.

It is within the scope of the invention to make the selection, dimensioning and sequence of the material layers, in particular also according to the teaching of EP 2 717 343 B1, so that the electrodes (22, 24) can also be designed individually or both as interdigital electrodes, and electrical voltages along the layers—and not through the layer thicknesses—can be applied or tapped.

On the right side of FIG. 1 it is indicated by a block that the substrate film (16) can be processed, for example, from a silicon wafer. The block generally symbolizes a one-sided fixation of the ME sensor on the right edge, so that it can oscillate in the manner of a self-supporting beam. In the exemplary embodiment, the mechanical natural frequency of the ME-sensor is determined to be $f_R=688$ Hz. The bending beam is about 20 mm long—free standing—and about 2 mm wide.

FIG. 2 shows the measuring voltage tapped between the electrodes (12) and (20) above the piezoelectric layer (10) as a function of the frequency. FIG. 2A shows the signal in the absence of electrical or magnetic alternating fields; there is only an acoustic coupling (interference by airborne sound). It should be noted that the measuring voltage is given on a logarithmic scale.

FIG. 2 B shows the measured voltage when a periodic modulation voltage $U_A(t)=U_0 \cos(2\pi f_{mod} t)$ is applied with $U_0$ as an amplitude and $f_{mod}$ as the modulation frequency to the electrodes (22) and (24). In the example of FIG. 2 B $U_0=40$ V and $f_{mod}=678$ Hz. Only a frequency component of the measurement voltage—specifically that for $f_{mod}$—is dominant, that is, the ME-sensor performs a forced oscillation besides its natural frequency.

The measured voltage in FIG. 2 C has a major component with the frequency $f_{mod}$ and two sideband components at the frequencies $f_{mod}-f_{measuring}$ and $f_{mod}+f_{measuring}$, if in addition to modulation voltage—in this case a square wave with period $1/f_{mod}$—through the dielectric phase (18) a measurement magnetic field with frequency $f_{measuring}$ also acts on the magnetostrictive phase (14). In the example according to FIG. 2 C the measured field has intensity amplitude $H_{measuring}=10$ Oe, the measuring field frequency $f_{measuring}=10$ Hz and the amplitude of the modulation voltage is $U_0=5$ V. Since the right side band (688 Hz) exactly excites the resonance of the ME sensor, the measurement voltage is exaggerated as desired—here by more than an order of magnitude compared to the left sideband.

Particularly in the present invention $f_{mod}$ may be varied over a predetermined frequency interval to pass through a frequency band of measuring magnetic fields. For any time-periodic modulation voltages, preferably square-wave voltages, the means for applying the modulating voltage is preferably so designed, to generally automatically vary the duration of the period between predetermined interval boundaries.

FIG. 2 shows the frequency components of the measurement voltage as immediate outputs of a spectrum analyzer, to which the voltage values have been continuously supplied. A downstream evaluation device may advantageously be configured to detect and to recorded and/or output the measuring voltage as a function of the period duration of the modulation voltage. In this case, the evaluation device preferably determines local maxima of the measurement voltage and concludes from the magnitude and position of at least one determined maximum on the amplitude and frequency of at least one magnetic field component to be measured. In the simplest case, the translation of measured voltage into magnetic field strength is based on a calibration table created in a single preliminary test.

The automatic search and translation of local voltage maxima in magnetic field strengths also supports the fast searching of a predetermined period duration interval or frequency band for any frequency components of the measuring magnetic field, if this has a plurality of—a priori possibly unknown—frequencies. It may be advantageous to provide a feedback of the evaluation device on the device for application of the modulation voltage, which in turn controls the varying of the modulation frequency. Modulation frequency ranges that lead to pronounced local voltage maxima can thus be searched for at an adapted—preferably reduced—speed, for example to determine more accurate peak values.

EP 2 635 913 B1 states that the frequency conversion succeeds without a constant bias magnetic field along the magnetostrictive phase. In this case, the amplitude of the modulation magnetic field is preferably set approximately at the field strength of the conventional bias constant field, which would otherwise be required, to set the range of the maximum piezomagnetic coefficient in the magnetostrictive phase as the operating point of the ME sensor.

Basically, in the present invention, a bias constant field is also completely dispensable, but in electrical modulation the magnetostrictive phase (14) does not usually stretch so far that it gets into the state with maximum piezomagnetic coefficient. It may therefore be advantageous here to provide a bias field for optimizing the operating point of the ME sensor. It is particularly advantageous to design the magnetostrictive phase (14) as a multilayered layer system with alternating ferromagnetic and antiferromagnetic layers, which according to the teaching of EP 2 538 235 B1 permit premagnetization of the layer system by exchange bias without appreciable stray fields (see exemplary embodiment). In this way, a high sensitivity for weak, low-frequency magnetic fields can be achieved even if a plurality of ME sensors are arranged adjacent to each other in a small space.

The invention claimed is:

1. A magnetic field measuring device comprising
   a magnetoelectric composite element with a piezo-electric phase (18) with non-linear stress-voltage characteristic curve, wherein the magnetoelectric composite element is formed as a mechanically vibratable oscillator which uses an electrode arrangement (22, 24) energized by means of a temporally periodic electrical modulation voltage, a means for tapping an electrical measuring voltage (12, 20) across a piezo-electric phase (10) having a linear strain-voltage characteristic curve upon deflection of the mechanically vibratable oscillator, an electrode arrangement (12, 20) on the piezoelectric phase (10) having a linear strain-voltage characteristic curve upon deflection of the mechanically vibratable oscillator, means for tapping an electrical measuring voltage across the piezo-electric phase (10) having a linear strain-voltage characteristic curve upon deflection of the mechanically vibratable oscillator upon deflection of the mechanically vibratable oscillator, and a magnetostrictive phase which is periodically modulated by the temporally periodic electric modulation voltage caused by the dielectric material (18) and experiences any externally inferred magnetic measuring field signal.

2. A magnetic field measuring device, comprising a magnetoelectric composite element, the magnetoelectric composite element formed as a mechanically vibratable oscillator, a first electrode assembly (12, 20) on a piezoelectric phase (10) having a linear strain-voltage characteristic curve upon deflection of the oscillator of the magnetoelectric composite element, means for picking up an electrical measurement voltage (10, 12) as member of the magnetoelectric composite element upon deflection of the oscillator over the piezoelectric phase (10) having a linear strain-voltage characteristic curve upon deflection of the oscillator upon deflection of the mechanically vibratable oscillator, a piezo-electric phase (18) with non-linear stress-voltage characteristic curve in material connection with the member of the magnetoelectric composite element and a second electrode assembly (22, 24) on the piezo-electric phase (18) and means for energizing the dielectric phase (18) by application of a temporally periodic electrical modulation voltage across the second electrode assembly (22, 24).

3. The magnetic field measuring device according to claim 1, wherein the piezoelectric phase (10) is formed of a piezoelectric material.

4. The magnetic field measuring device according to claim 2, wherein the dielectric phase (18) is formed of a ferroelectric or a relaxor material.

5. The magnetic field measuring device according to claim 4, wherein the ferroelectric material is a material from the group lead zirconate titanate (PZT), barium titanate, potassium sodium niobate (KNN), or sodium bismuth titanate (NBT).

6. The magnetic field measuring device according to claim 4, wherein the relaxor material is a material from the group lead magnesium niobate is (PMN) or lead lanthanum zirconium titanate (PLZT).

7. A magnetic field measuring method with a magnetoelectric composite element as oscillator, in which a time-dependent measuring magnetic field acts on a magnetostrictive phase of the oscillator, and in which an electrical modulation voltage is applied across a piezoelectric phase of the oscillator and is used to infer the time-dependent measuring magnetic field, the method comprising:

(i) providing at least two dielectric phases in a materially bonded connection with the magnetostrictive phase of the oscillator, wherein, when an electrical voltage is applied, a dielectric phase exhibits a change in length, the magnitude of which change in length depends in a non-linear manner on the magnitude of the electrical modulation voltage applied across a piezo-electric material, (ii) applying a temporally periodic electrical modulation voltage to the dielectric phase, (iii) inferring the time-dependent measuring magnetic field acting on a magnetostrictive material, and (iv) monitoring a time dependent charge generated on a piezoelectric material, exhibiting a linear stress-voltage dependency, wherein the mechanically vibratable mechanical oscillator has a natural period, wherein a means for applying the temporally periodic electrical modulation voltage is designed for presetting a period of the electrical modulation voltage, which differs from the natural period of the mechanically vibratable mechanical oscillator by a predetermined difference amount greater than zero.

8. The magnetic field measuring device according to claim 7, wherein the means for applying temporally periodic electrical modulation voltage is arranged to output a square wave voltage, which causes a periodic non-linear expansion of the piezoelectric phase (18), wherein a differential piezoelectric coefficient in the piezoelectric phase (10) is switched back and forth between positive and negative values.

9. The magnetic field measuring device according to claim 7, wherein the means for applying temporally periodic electrical modulation voltage is adapted to automatically vary the period of the temporally periodic electrical modulation voltage between predetermined interval boundaries.

* * * * *